United States Patent
Trivedi et al.

(10) Patent No.: US 11,757,463 B2
(45) Date of Patent: Sep. 12, 2023

(54) SELF-CALIBRATION OF REFERENCE VOLTAGE DROP IN DIGITAL TO ANALOG CONVERTER

(71) Applicant: NXP USA, Inc., Austin, TX (US)

(72) Inventors: Ronak Prakashchandra Trivedi, Cupertino, CA (US); Hanqing Xing, Cupertino, CA (US); See-Hoi Wong, Fremont, CA (US); Jean CauXuan Le, Santa Clara, CA (US); Ranga Seshu Paladugu, Milpitas, CA (US)

(73) Assignee: NXP USA, Inc., Austin, TX (US)

( * ) Notice: Subject to any disclaimer, the term of this patent is extended or adjusted under 35 U.S.C. 154(b) by 39 days.

(21) Appl. No.: 17/574,299

(22) Filed: Jan. 12, 2022

(65) Prior Publication Data
US 2023/0223947 A1 Jul. 13, 2023

(51) Int. Cl.
*H03M 1/10* (2006.01)
*H03M 1/68* (2006.01)
*H03M 1/78* (2006.01)

(52) U.S. Cl.
CPC ......... *H03M 1/1028* (2013.01); *H03M 1/687* (2013.01); *H03M 1/785* (2013.01)

(58) Field of Classification Search
CPC .... H03M 1/1028; H03M 1/687; H03M 1/765; H03M 1/785
USPC .......................................... 341/120, 144–145
See application file for complete search history.

(56) References Cited

U.S. PATENT DOCUMENTS

| 8,013,772 B2 * | 9/2011 | Li .................. H03M 1/785 341/154 |
| 9,276,598 B1 * | 3/2016 | Li .................. H03M 1/1057 |
| 9,337,860 B1 | 5/2016 | Li et al. |

OTHER PUBLICATIONS

Guo et al., "An Area- and Power-Efficient Iref Compensation Technique for Voltage-Mode R—2R DACs," IEEE Transactions on Circuits and Systems-II: Express Briefs, vol. 62, No. 7, Jul. 2015, pp. 656-660; 5 pages.
Souders et al. "A 20 bit + sign, relay switched D NBS TN 1105", NIST, National Institute of Standards and Technology (NIST), Oct. 1, 1979 (Oct. 1, 1979), pp. 1-34.
Halbert et al., "An 18-Bit Digital-to-Analog Converter for High-Performance Digital Audio Applications", Journal of the Audio Engineering Society, Audio Engineering Society, New York, NY, US, vol. 36, No. 6, Jun. 1, 1988, pp. 469-480.

(Continued)

*Primary Examiner* — Khai M Nguyen (57) ABSTRACT

A method for self-calibration of reference voltage drop in a Digital to Analog Converter (DAC) includes measuring each one of a plurality of thermometric weightages associated with a respective one of a plurality of thermometric bits, wherein the DAC includes a plurality of sub-binary bits and the plurality of thermometric bits. For each sequentially increasing combination of thermometric bit settings including at least two thermometric bits coupled to a high reference voltage and each sub-binary bit coupled to a low reference voltage, performing the steps of: determining a respective combined weightage correction; adding the combined weightage correction to the highest order bit of the combination of thermometric bit settings; and incrementing a number of bits of the combination of thermometric bit settings in response to the number of bits of the sequential combination being less than a total number of the plurality of thermometric bits.

20 Claims, 9 Drawing Sheets

(56) References Cited

OTHER PUBLICATIONS

Chen et al., "Design of Current-Mode Digital-to-Analog-Converter in Hybrid Architecture", IEEE-NEWCAS Conference, 2005. The 3rd International Quebec City, Canada Jun. 19-22, 2005, Piscataway, NJ, USA, IEEE, Jun. 19, 2005, pp. 232-235.
Lin et al., "A Resolution-Reconfigurable Asynchronous SAR ADC with Segmented and Non-Binary Weighted Capacitance DACs", Advances in Science, Technology and Engineering Systems Journal, vol. 5, No. 2, Apr. 1, 2020, pp. 665-672.
Shu et al., "An Oversampling SAR ADC With DAC Mismatch Error Shaping Achieving 105 dB SFDR and 101 dB SNDR Over 1 KHz BW in 55 nm CMOS", IEEE Journal of Solid-State Circuits, vol. 51, No. 12, Dec. 1, 2016, pp. 2928-2940.
Marche et al., "Modeling R-2R Segmented-Ladder DACs", IEEE Transactions on Circuits and Systems I: Regular Papers, IEEE, US, vol. 57, No. 1, Jan. 1, 2010, pp. 31-43.

\* cited by examiner

SELF-CALIBRATION OF REFERENCE VOLTAGE DROP IN DIGITAL TO ANALOG CONVERTER

FIELD

This disclosure relates generally to a Digital to Analog Converter (DAC), and more specifically to calibration of a sub-binary DAC.

BACKGROUND

A precision transceiver system typically includes a high-resolution DAC and a high-resolution Analog to Digital Converter (ADC). For example, industrial applications may require a 16-bit accurate transmit path and at least a 20-bit accurate receive path integrated into a single-chip solution. A high-resolution delta-sigma ($\Delta\Sigma$) modulator is well suited for the input quantization because of its high resolution and inherent linearity. Furthermore, the noise level of the delta-sigma modulator can be well controlled by increasing the over sampling ratio (OSR). Such ADCs do not require much, if any, high-accuracy trimming and calibration.

On the transmit side, a highly linear DAC is required to provide accurate output levels. However, high accuracy DACs are not straightforward to implement and usually involve highly accurate and costly analog trimming procedures. A sub-binary DAC structure is capable of generating finer-resolution levels with redundant bits, however, its linearity is limited by the accuracy of the analog measurements of its bit weightages.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A DAC may use an R-2R resistor ladder network to convert input digital code to an analog value. Similarly, a sub-binary DAC uses an R-BR resistor ladder, where B is a value larger than 2 to provide redundancy, hence providing overlapping input codes to compensate for various sources of mismatch. As this overlap reduces the output range, additional redundant bits are often added to the DAC. Each leg of the R-BR ladder may be individually adjusted with a respective "weightage" to reduce non-monotonicity in the conversion of digital inputs to an analog output.

DAC weightages may be calibrated, to reduce the impact of measurement non-linearity on the final accuracy of the calibrated DAC. By measuring or determining each weightage independently from the other weightages, rather than using a cumulative method, the input range of an ADC used for the calibration is constrained. Accordingly, the non-linear error induced by the ADC for weightage measurement is significantly reduced. However, a code depend voltage drop across the routing parasitic resistance of the DAC positive and/or Negative reference voltage line does not get calibrated, and hence impacts Integral Non-Linearity (INL) of the DAC significantly.

Embodiments described herein provide for the reduction of the impact of non-linearity caused by a code dependent voltage drop across a routing resistance in the negative reference line. In some embodiments, this same reduction may also be applied to the positive reference line.

Figure 1:
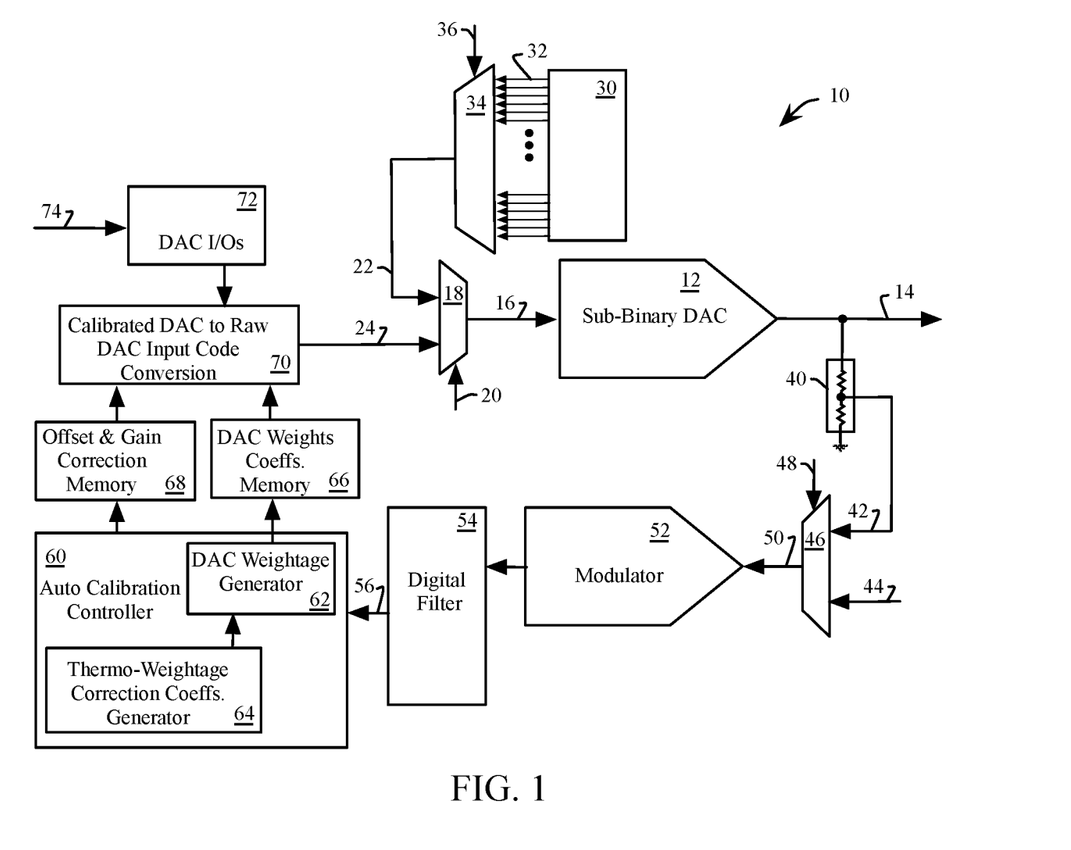
FIG. 1 is a schematic view of a system for DAC self-calibration, in accordance with example embodiments of the present disclosure.

FIG. 1 shows a schematic view of an embodiment 10 of a transceiver system including a DAC with a loopback for self-calibration. The embodiment 10 includes a sub-binary DAC 12 generating an analog output 14 from a 22-bit digital input 16. The digital input 16 is provided by a multiplexer 18, which selects with a control signal 20, either a 22-bit input 22 or a 22-bit input 24. During self-calibration, the input 22 is provided by a look-up table 30, which sequentially provides a series of digital codes 32, selected by a multiplexer 34 with a control signal 36. The codes 32 include a zero-scale value, a full-scale value and each bit weight therein between. In one embodiment, the analog output 14 from the sub-binary DAC 12 is shifted with a voltage level shifter 40 to provide an internal DAC output 42 with a range appropriate for a subsequent conversion with an ADC. The internal DAC output 42 and external analog inputs 44 are multiplexed with a multiplexor 46, controlled by a control signal 48 and thereby providing an output 50. The output 50 is converted by a 24-bit delta-sigma ($\Delta\Sigma$) ADC formed by a modulator 52 and a digital filter 54, to provide an output 56 as a 24-bit digital signal.

The 24-bit output 56 is used by an auto calibration controller 60 to generate DAC weightages with a DAC weightage generator 62 receiving inputs from a thermo-weightage correction coefficients generator 64, (used to correct a code-dependent reference voltage drop error). The auto calibration controller 60 stores the corrected weightage coefficients in a memory 66 (e.g., a One Time Programmable memory or a Random Access Memory). The auto calibration controller 60 also determines and stores offset and gain corrections in a memory 68. In one embodiment, the memories 66 and 68 are merged into one memory.

A calibrated DAC to Raw DAC input code converter 70 receives from a DAC I/O circuit 72, 18-bit Raw DAC inputs 74. The converter 70 extends the Raw DAC inputs 74 to a 22-bit input 24 with corrections for offset and gain (from the memory 68), and corrected weightages (from the memory 66). The following illustrative examples include an 18-bit Raw DAC input 74 with sub-binary weighting, and an additional 4 thermometric Most Significant Bit (MSBs) to form a 22-bit word. It should be appreciated that other data widths are realizable and within the scope of this disclosure.

Figure 2:
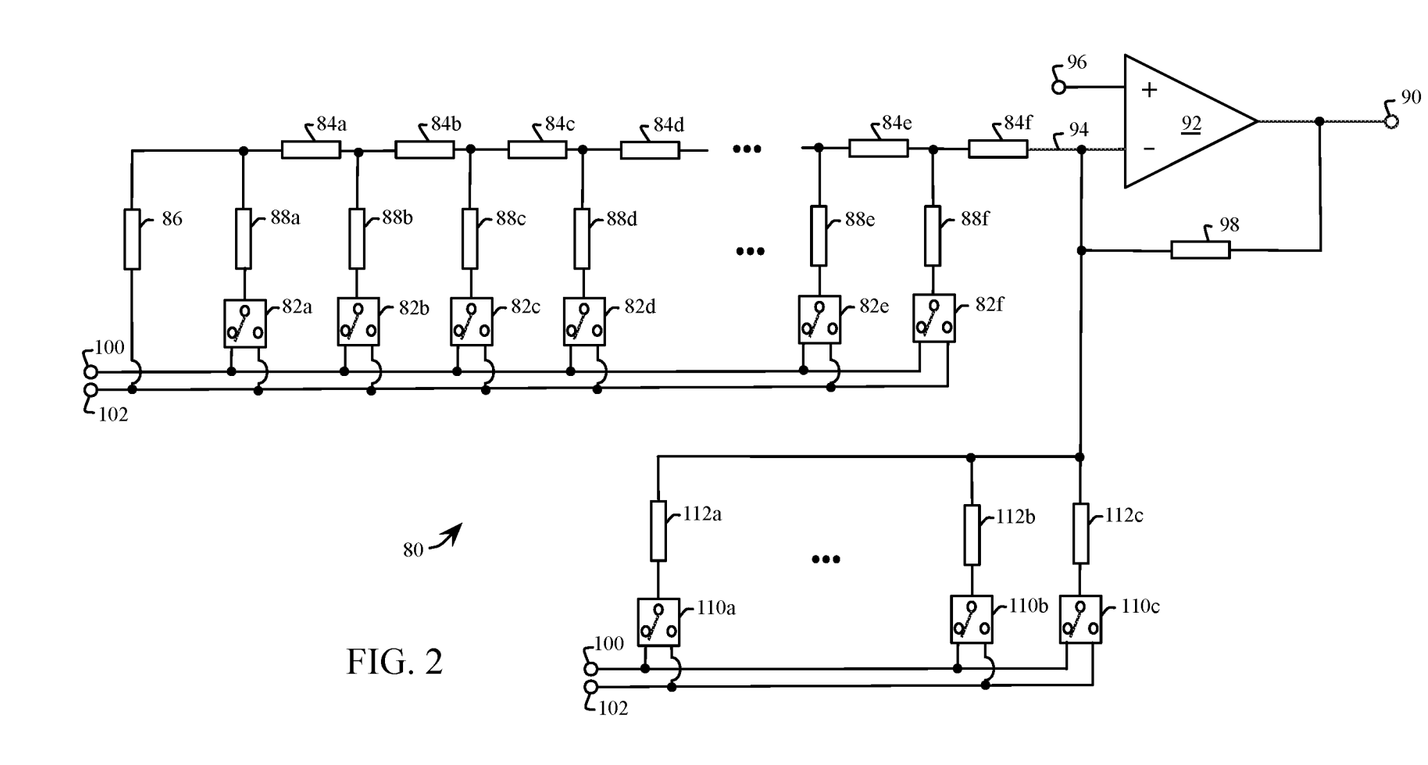
FIG. 2 is a schematic view of an embodiment of a 22-bit segmented sub-binary DAC.

FIG. 2 shows an embodiment 80 of a sub-binary resistive DAC, similar to that used by the DAC 12 of FIG. 1. The embodiment 80 includes a plurality of switches 82a, 82b, 82c, 82d through 82e and 82f (generally 82). The embodiment 80 further includes a plurality of corresponding resistors 84a, 84b, 84c, 84d through 84e and 84f (generally 84). The embodiment 80 further includes a terminating resistor 86 and a plurality of corresponding weighted resistors 88a, 88b, 88c, 88d through 88e and 88f (generally 88). In an R-2R ladder, the value of the terminating resistor 86 and the weighted resistors 88 are typically the same, and twice that of each of the resistors 84. In a sub-binary DAC, the value of the terminating resistor 86 and the weighted resistors 88 are greater than twice that of each of the resistors 84, thereby creating overlap between the digital input codes to beneficially compensate for mismatch between the various resistors and other manufacturing or environmental based variations. The current output 94 of the sub-binary ladder is converted to a voltage at an output 90 (e.g., the analog output 14 of FIG. 1). The switches 82 connect respective weighted resistors 88 to either a high reference voltage 100 or a low reference voltage 102 in response to a digital input code (e.g. the lower 18 binary bits of input 16 in FIG. 1).

The input code overlap resulting from the use of a sub-binary ladder, reduces the output range of the output 90. The output range may be recovered by adding an extra number of stages (or bits) than are actual required for the desired resolution of the sub-binary (e.g., R-BR), DAC. In such high-resolution R-BR DACs, segmentation is necessary to reduce the sensitivity from variation of a DAC switch on resistance and other parasitic resistances in series with it. A segmented DAC architecture as shown in FIG. 2, whereby additional thermometric inputs are added to control the MSB bits of the DAC. Specifically, switches 110a through 110b and 110c (generally 110) connect respective weighted resistors 112a through 112b and 112c (generally 112) to either the high reference voltage 100 or the low reference voltage 102, in response to upper 4 binary bits (decoded as 15 thermometric bits) of input 16 in FIG. 1. Such segmentation also reduces the impact of the finite "ON" resistance of the switches 110, state dependent mismatch of the ON resistance (dependent upon connection to either the high reference voltage 100 or low reference voltage 102), and temperature drift of the ON resistances.

Figure 3:
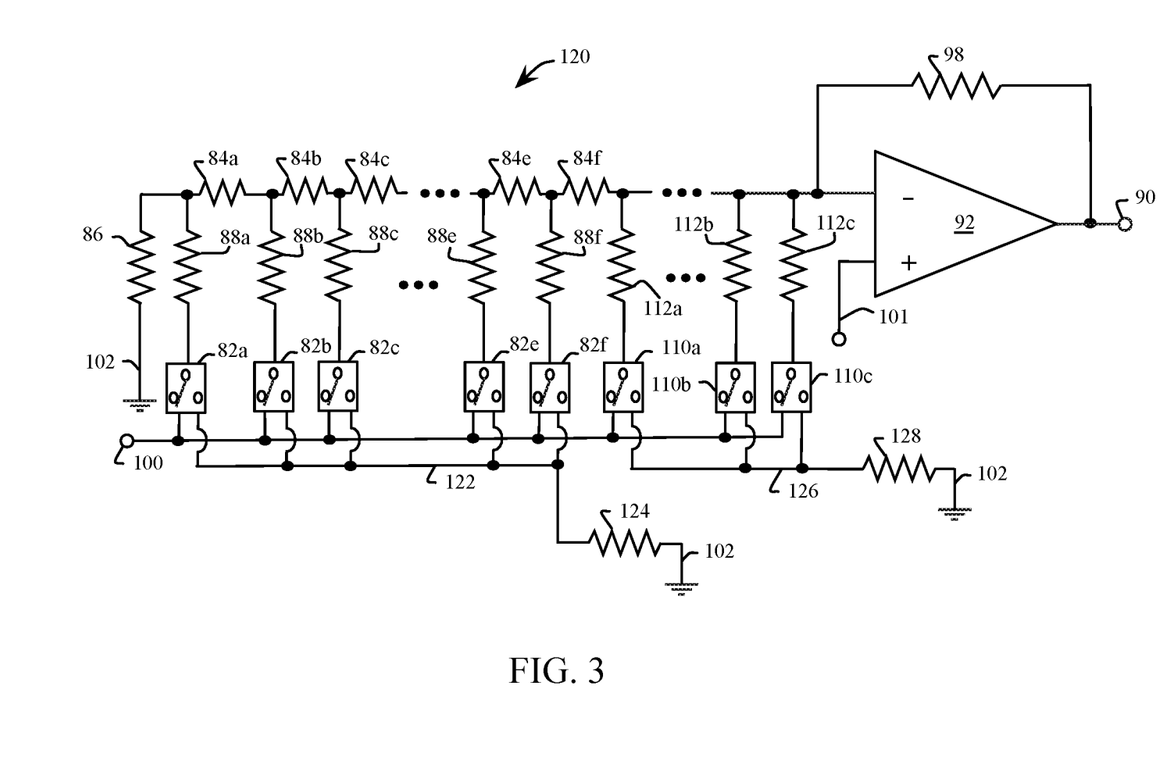
FIG. 3 is a schematic view of a segmented sub-binary DAC having split voltage reference lines for thermometric and sub-binary sections, in accordance with example embodiments of the present disclosure.

FIG. 3 with continued reference to FIG. 2, shows another embodiment 120 of a 22-bit segmented sub-binary DAC having split-voltage reference lines for thermometric and sub-binary sections. Similar to FIG. 2, the embodiment 120 of FIG. 3 includes 18 Least Significant Bits (LSBs) controlling sub-binary switches 82, and 4 MSBs controlling 15 thermometric switches 110. The effect of a parasitic resistance on the positive reference line (e.g., the high reference voltage) 100 may be minimized with an active buffer. In the embodiment 120, the low reference voltage is connected to ground to save power. The positive input 101 to the amplifier 92 is biased to a DC level other than ground. However, connecting the low reference voltage 102 to ground leads to a code dependent voltage drop across this reference line, which negatively impacts linearity. Similarly, a code dependent voltage drop across the positive reference line 100 may degrade linearity, however an active positive reference buffer may regulate this drop across a long routing resistance of the positive reference line 100. As shown in FIG. 3, the low reference voltage line 102 may be split into a low reference voltage 122 for the sub-binary section, with a parasitic resistance 124, and a low reference voltage 126 for the thermometric section, with a parasitic resistance 128. Accordingly, the code depend voltage drop across the parasitic resistor 128 is more significant than across the parasitic resistor 124 because the thermometric section is controlled by MSBs. A significant reduction in code dependent non-linearity (and a simplified design) is therefore realized by just resolving the code dependency related to the parasitic resistance 128.

Figure 4:
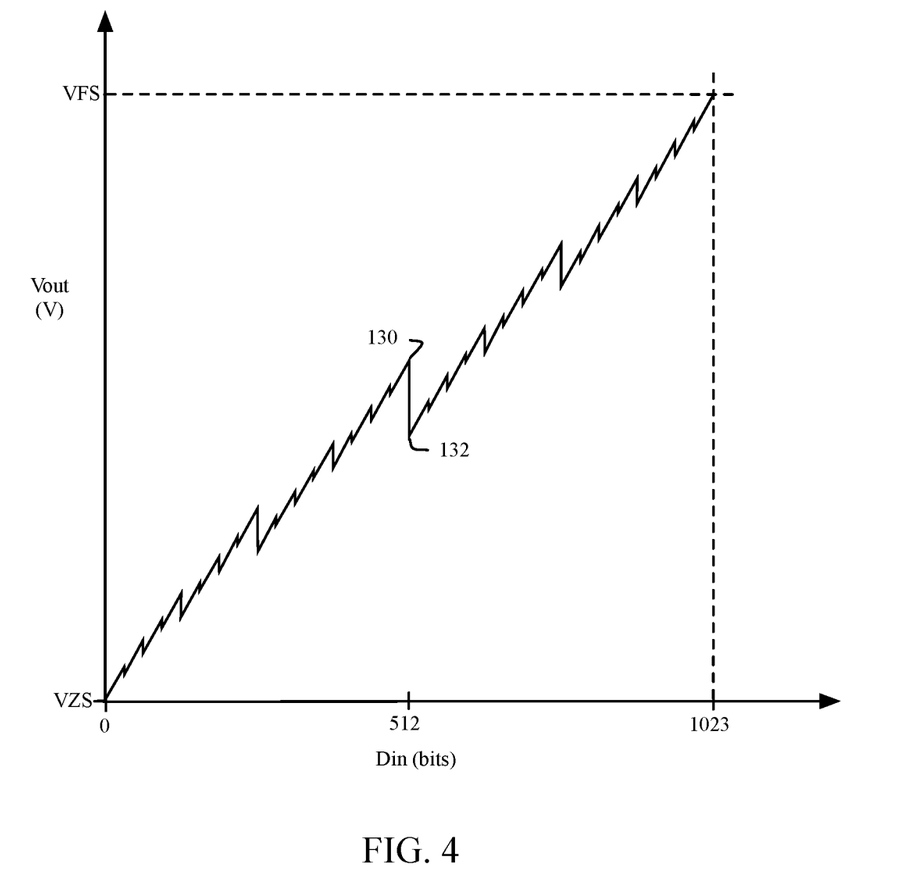
FIG. 4 is a graphical view of a transfer curve of an embodiment of a 10-bit sub-binary DAC showing non-monotonic transfer characteristics.
Figure 5:
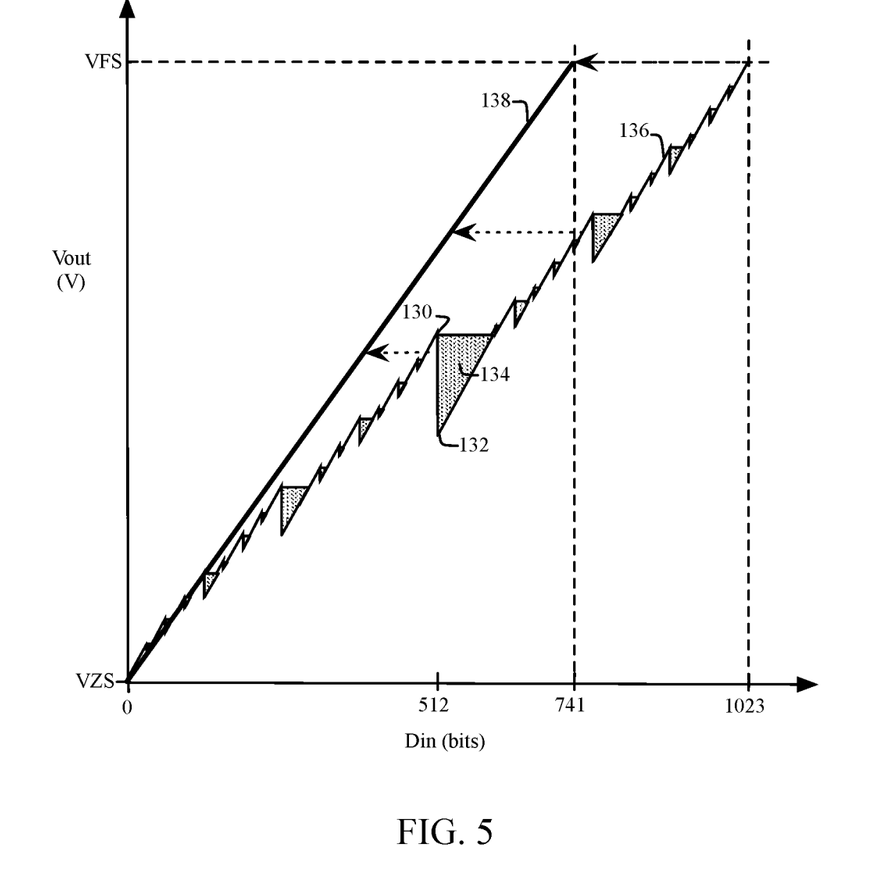
FIG. 5 is a graphical view of a transfer curve of a 10-bit sub-binary DAC after calibration to remove non-monotonic transfer characteristics.

FIG. 4 shows a transfer curve of a 10-bit sub-binary DAC, similar to the embodiment 120 of FIG. 3. The overlapping codes of the sub-binary DAC result in the non-monotonic transfer curve as shown by the reversal of output voltages 130 and 132 with mid-scale digital input, as well as at other points on the curve. Advantageously, the sub-binary DAC improves resolution across the voltage range shown as a Zero Scale (VZS) and Full Scale (VFS). In contrast to FIG. 4, FIG. 5 shows a transfer curve after calibration to remove the non-monotonic regions, one of which is shown as region 134 from the transfer curve 136. After removal of the non-monotonic regions 134, the resolution of the curve will be limited by the number of outputs (e.g. 741) in the new transfer curve 138, in the example of FIG. 5. In general, the resolution and linearity of the final calibrated DAC will be several bits less than the original DAC's resolution (e.g. the 22-bit DAC 12 of FIG. 1 may be limited to the 18-bits, thereby restoring the original 18-bit input 74 with improved INL). In calibration mode, VZS and VFS will also be measured, in addition to the analog bit weightages. The measurements later will be used to rebuild the monotonic transfer curve in normal operation.

With reference to FIG. 1 and FIG. 3, the measurement and determination of the thermometric weightages and respective correction factors of a 22-bit sub-binary DAC with upper 4 MSBs converted to thermometric bits, may also be expressed as follows. A voltage drop (e.g., an "IR" drop) across resistor 128 (or Rg1) with all switches 110 connecting respective weighted resistors 112 to the low reference voltage 126 is expressed by:

$$X = Ith * Rg1$$

where Ith is the total cumulative current flowing through the resistor 128 (Rg1). Each weighted resistor 112 (Rs) may be expressed as a ratio of the resistor 84 (R) as follows:

$$Rs = B * R$$

The voltage at the output 14 of the DAC 12, (equal to the output 90 of FIG. 3), when all switches 110 connecting respective weighted resistors 112 to the low reference voltage 126 is expressed by the term DACOUT(0).

Similarly, for each thermometric weightage, measured at the output 14 of the DAC 12, all except one switch 110 are connected to the low reference voltage 126, and the respective one switch 110 is connected to the high reference voltage 100. For example, the thermometric weightage WT1 and WT15, where the one respective switch 110 is switch 110a and 110c is expressed as follows:

$$WT1 = DACOUT(T1) - DACOUT(0)$$

$$WT15 = DACOUT(T15) - DACOUT(0) \quad \text{Equation (0)}$$

During the code conversion process performed by the code converter 70 of FIG. 1, the measured thermometric weightages are used to convert the 18-bit input 74 to a 22-bit non-binary code as in input 24. In one embodiment, a successive approximation method is used to determine the 22-bit raw DAC code 24 from the 18-bit input code 74 using the measured and calibrated weightages. The measured values of WT1 though WT15 are assumed to be the same, prior to calibration and may be expressed as follows:

$$WT1=WT2=\ldots WT15=Rf^*[Vrefp/Rs+(-29/15)^*(X/Rs)]$$

$$X=Rg1^*Vc/(Rs/15) \quad \text{Equation (1)}$$

where Rf is the feedback resistor 98, Rs is defined above, Vrefp is the high reference voltage 100, and Vc is the common mode bias (e.g., ground 102 in FIG. 3), applied to the positive input of the amplifier 92.

A "weightage total" (e.g., "B"), is determined by summating each of the thermometric weightages as follows:

$$B=WT1+WT2+\ldots WT15=15^*Rf/Rs^*[Vrefp+(-29/15)/(X)]$$

$$\text{or } B=15^*Rf/Rs^*[Vrefp+(-29/15)/(X)] \quad \text{Equation (2)}$$

A "thermometric range" (e.g., "C"), is measured as follows, wherein each of the thermometric bits are connected to the high reference voltage 100, and each of the sub-binary bits are connected to the low reference voltage 102:

$$C=DACOUT(T1+T2+\ldots T15)-DACOUT(0)$$

$$\text{or } C=15^*Vrefp^*Rf/Rs-[15^*Rf^*X/Rs] \quad \text{Equation (3)}$$

In another embodiment, the values of B and C are measured through an on-chip ADC 52 and 54 as shown in FIG. 1. A "scaling factor" (e.g., "M") is determined by subtracting the weightage total "B" from the thermometric range "C", as follows:

$$M=C-B$$

$$\text{or } M=Rf^*14X/Rs \quad \text{Equation (4)}$$

While each of the thermometric weightages are measured independently, per Equation (1), there will be non-linear errors introduced at the output 14 of the DAC 12, when more than one thermometric bit is set in a high state (e.g., connected to the high reference voltage 100). Consequently, the non-linear errors do not apply to the single thermometric bit WT1, however these errors do apply to thermometric bits WT2 through WT15, expressed as a "combined weightage correction."

For example, the combined weightage correction for WT2 (e.g., WT1 and WT2 are connected to the high reference voltage 100), is determined as follows:

$$\text{A "first value"}-\text{"second value"}=DACOUT(T1+T2)-DACOUT(0)$$

$$\text{or } =Rf^*[2^*Vrefp/Rs+(-56/15)^*(X/Rs)] \quad \text{Equation (5)}$$

To find the error in WT2, the summation of weightages, WT1+WT2 from Equation (1) is subtracted from Equation (5) (e.g., "first value"−"second value") to generate the following "combined weightage correction" for WT2

$$\Delta WT2=DACOUT(T1+T2)-DACOUT(0)-WT1-WT2$$

$$\text{or } \Delta WT2=2\ ^*X^*Rf/(15^*Rs)$$

The error ΔWT2 may be normalized with the scaling factor "M" to provide a correction with a single parameter, as follows:

$$\Delta WT2=2^*M/(14^*15) \quad \text{Equation (6)}$$

For a further example, the combined weightage correction for WT3 (e.g., WT1, WT2 and WT3 are connected to the high reference voltage 100), is determined as follows:

$$\Delta WT3=DACOUT(T1+T2+T3)-DACOUT(0)-WT1-WT2-WT3$$

$$\text{or } \Delta WT3=6^*X^*Rf/(15^*Rs) \quad \text{Equation (7)}$$

Assuming the correction factor for ΔWT2 has already been applied as the combined weightage corrections are iteratively determined by sequentially stepping through each combination of WT1 settings, the required correction to be applied to WT3 (e.g., the highest order bit of the combination of thermometric bit settings, is as follows:

$$\Delta WT3=4^*M/(14^*15) \quad \text{Equation (8)}$$

Similarly, the correction factors ΔWT4 through ΔWT15 for respective thermometric bits WT4 through WT15 are determined. Corrected thermometric weightages WT2c through WT15c are determined by summating each thermometric weightage with the respective thermometric weightage correction.

Figure 6:
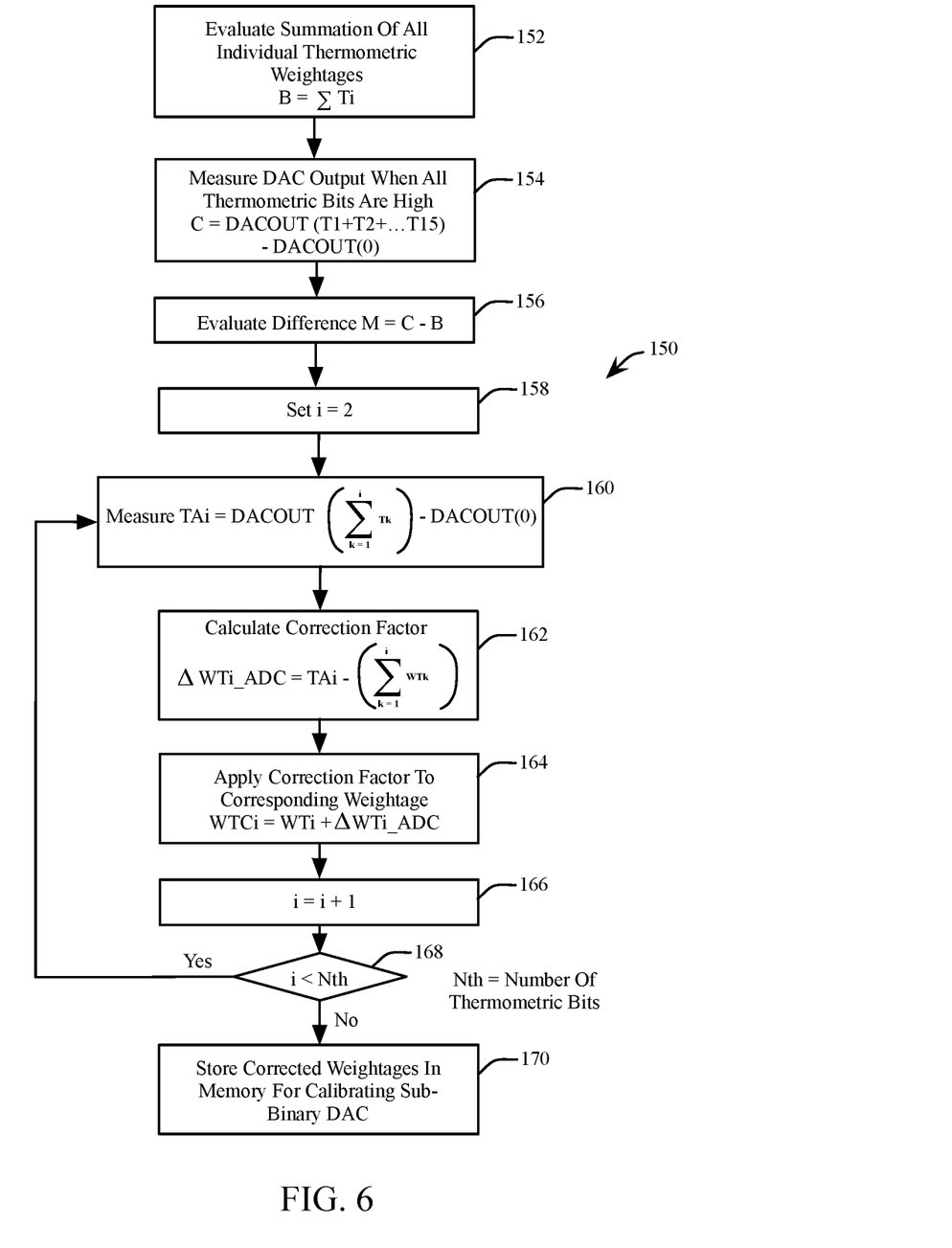
FIG. 6 is a flowchart representation of a method for self-calibration of a reference voltage drop in a DAC, in accordance with an embodiment of the present disclosure.

FIG. 6 shows an example embodiment 150 of a method for self-calibration of a reference voltage drop in a DAC. With reference to FIG. 1, FIG. 3 and the embodiment 150 of FIG. 6, at 152 each thermometric weightage is summated to determine a weightage total "B". At 154, a thermometric range "C" is determined. At 156, a scaling factor "M" is determined. At 158, a parameter "i" is set to 2 (e.g., non-linear errors do not apply to the single thermometric bit WT1). At 160, a "first value" minus a "second value" is determined, (see Equation 5). At 162, a combined weightage correction is determined (see Equation 6). At 164, the highest order bit of the combination of thermometric bits is corrected with the combined weightage correction. at 166, the parameter "i" is incremented. At 168, if the number of bits of the sequential combination is less than a total number of the plurality of thermometric bits, then the method proceeds to 160, else the method continues to 170. At 170, the corrected weightages (WT1c through WT15c) are stored in a memory 66 of FIG. 1 for calibrating the sub-binary DAC 12.

Figure 7:
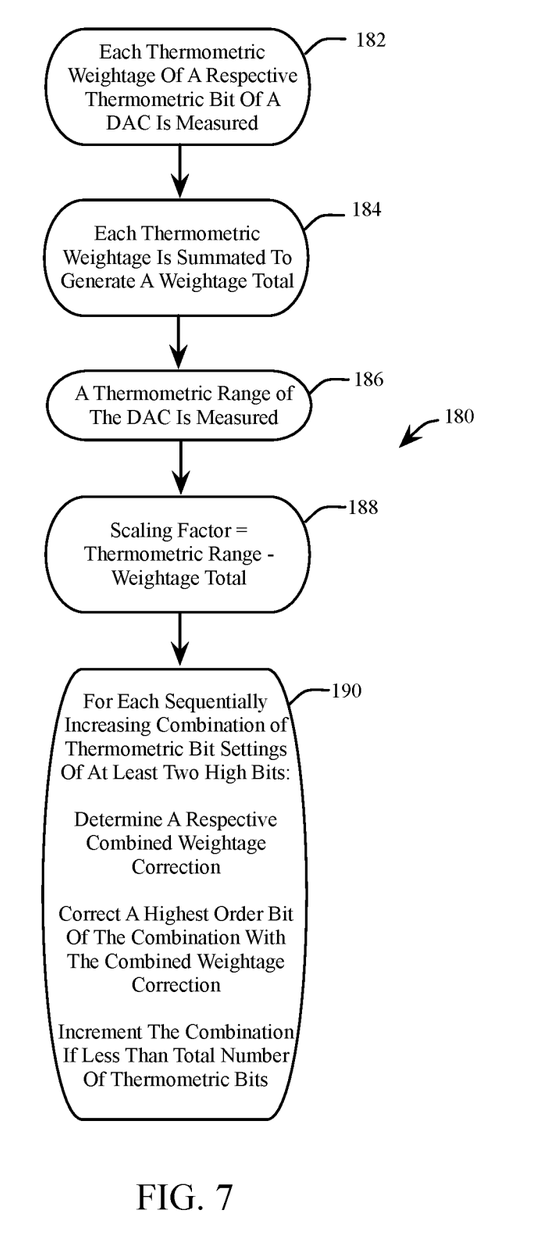
FIG. 7 is a flowchart representation of another method for self-calibration of a reference voltage drop in a DAC, in accordance with an embodiment of the present disclosure.

FIG. 7 shows an example embodiment 180 of a method for self-calibration of a reference voltage drop in a DAC. With reference to FIG. 1, FIG. 3 and the embodiment 180 of FIG. 7, at 182 each thermometric weightage of each thermometric bit of the DAC 12 is measured. At 184, each thermometric weightage is summated to generate a weightage total "B." At 186, a thermometric range "C" of the DAC 12 is measured. At 188, a scaling factor "M" is determined. At 190, for each sequentially increasing combination of thermometric bit settings of a least two bits (e.g., WT1 and WT2), a respective combined weightage correction is determined, a highest order bit of the combination is corrected and the combination is incremented if the number of bits of the sequential combination is less than a total number of the plurality of thermometric bits.

Figure 8:
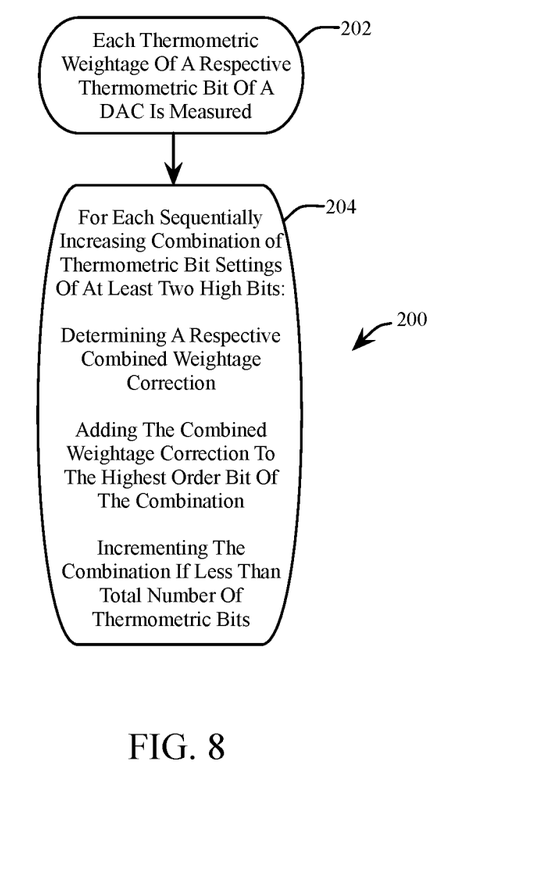
FIG. 8 is a flowchart representation of another method for self-calibration of a reference voltage drop in a DAC, in accordance with an embodiment of the present disclosure.

FIG. 8 shows an example embodiment 200 of a method for self-calibration of a reference voltage drop in a DAC. With reference to FIG. 1, FIG. 3 and the embodiment 200 of FIG. 8, at 202 each thermometric weightage of each thermometric bit of the DAC 12 is measured. At 204, for each sequentially increasing combination of thermometric bit settings of a least two bits (e.g., WT1 and WT2), a respective combined weightage correction is determined, the combined weightage correction is added to the highest order bit of the combination, and the combination is incremented if the number of bits of the sequential combination is less than a total number of the plurality of thermometric bits.

Figure 9:
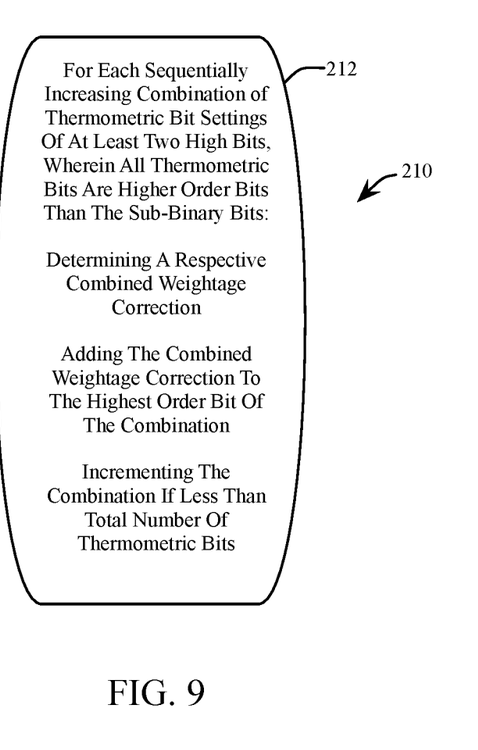
FIG. 9 is a flowchart representation of another method for self-calibration of a reference voltage drop in a DAC, in accordance with an embodiment of the present disclosure.

FIG. 9 shows an example embodiment 210 of a method for self-calibration of a reference voltage drop in a DAC. With reference to FIG. 1, FIG. 3 and the embodiment 210 of FIG. 9, at 212 for each sequentially increasing combination of thermometric bit settings of a least two bits (e.g., WT1 and WT2), wherein all thermometric bits are higher order bits than the sub-binary bits, a respective combined weightage correction is determined, the combined weightage correction is added to the highest order bit of the combination, and the combination is incremented if the number of bits of the sequential combination is less than a total number of the plurality of thermometric bits.

As will be appreciated, at least some of the embodiments as disclosed include at least the following. In one embodiment, a method for self-calibration of reference voltage drop in a Digital to Analog Converter (DAC) comprises measuring each one of a plurality of thermometric weightages associated with a respective one of a plurality of thermometric bits, wherein the DAC comprises a plurality of sub-binary bits and the plurality of thermometric bits. Each of the thermometric weightages are summated to generate a weightage total. A thermometric range of the DAC is measured. A scaling factor is determined by subtracting the weightage total from the thermometric range. For each sequentially increasing combination of thermometric bit settings comprising at least two thermometric bits coupled to a high reference voltage and each sub-binary bit coupled to a low reference voltage, performing the steps of: determining a respective combined weightage correction; correcting a highest order bit of the combination of thermometric bit settings with the combined weightage correction; and incrementing a number of bits of the combination of thermometric bit settings in response to the number of bits of the sequential combination being less than a total number of the plurality of thermometric bits.

Alternative embodiments of the method for self-calibration of reference voltage drop in a Digital to Analog Converter (DAC) include one of the following features, or any combination thereof. Measuring each thermometric weightage comprises measuring a first value of an output of the DAC while coupling each sub-binary bit to the low reference voltage, and only the respective thermometric bit to the high reference voltage, measuring a second value of the output of the DAC with all sub-binary bits and all thermometric bits coupled to the low reference voltage, and subtracting the second value from the first value. Measuring the thermometric range comprises measuring a first value of an output of the DAC while coupling each sub-binary bit to the low reference voltage, and each thermometric bit to the high reference voltage, measuring a second value of the output of the DAC with all sub-binary bits and all thermometric bits coupled to the low reference voltage, and subtracting the second value from the first value. Determining the respective combined weightage correction comprises measuring a first value of an output of the DAC for the respective combination of thermometric bit settings, subtracting a second value of the output of the DAC, measured with all sub-binary bits and all thermometric bits coupled to the low reference voltage, and subtracting the weightage for each thermometric bit of the combination coupled to the high reference voltage. A first sequentially increasing combination of thermometric bit settings comprises two thermometric bits coupled to the high reference voltage, and a remainder of the thermometric bits coupled to the low reference voltage. Correcting the highest order bit of the combination of thermometric bit settings comprises adding the combined weightage correction to the highest order bit. The respective combined weightage correction is normalized with the scaling factor to form a correction with a single parameter. Each combined weightage correction is stored in a memory. A raw DAC input is adjusted with one or more of the combined weightage corrections to generate a calibrated DAC input, wherein the calibrated DAC input comprises a reduced dependence on a resistive voltage drop in the high reference voltage. Each of the thermometric bits comprise higher order bits than each of the sub-binary bits.

In another embodiment, a method for self-calibration of reference voltage drop in a Digital to Analog Converter (DAC) comprises measuring each one of a plurality of thermometric weightages associated with a respective one of a plurality of thermometric bits, wherein the DAC comprises a plurality of sub-binary bits and the plurality of thermometric bits. For each sequentially increasing combination of thermometric bit settings comprising at least two thermometric bits coupled to a high reference voltage and each sub-binary bit coupled to a low reference voltage, performing the steps of: determining a respective combined weightage correction; adding the combined weightage correction to the highest order bit of the combination of thermometric bit settings; and incrementing a number of bits of the combination of thermometric bit settings in response to the number of bits of the sequential combination being less than a total number of the plurality of thermometric bits.

Alternative embodiments of the method for self-calibration of reference voltage drop in a Digital to Analog Converter (DAC) include one of the following features, or any combination thereof. Measuring each thermometric weightage comprises measuring a first value of an output of the DAC while coupling each sub-binary bit to the low reference voltage, and only the respective thermometric bit to the high reference voltage, measuring a second value of the output of the DAC with all sub-binary bits and all thermometric bits coupled to the low reference voltage, and subtracting the second value from the first value. Determining the respective combined weightage correction comprises measuring a first value of an output of the DAC for the respective combination of thermometric bit settings, subtracting a second value of the output of the DAC, measured with all sub-binary bits and all thermometric bits coupled to the low reference voltage, and subtracting the weightage for each thermometric bit of the combination coupled to the high reference voltage. A first sequentially increasing combination of thermometric bit settings comprises two thermometric bits coupled to the high reference voltage, and a remainder of the thermometric bits coupled to the low reference voltage. Each of the thermometric weightages are summated to generate a weightage total, a thermometric range of the DAC is measured, and a scaling factor is determined by subtracting the weightage total from the thermometric range. Measuring the thermometric range comprises measuring a first value of an output of the DAC while coupling each sub-binary bit to the low reference voltage, and each thermometric bit to the high reference voltage, measuring a second value of the output of the DAC with all sub-binary bits and all thermometric bits coupled to the low reference voltage, and subtracting the second value from the first value.

In another embodiment, a method for self-calibration of reference voltage drop in a Digital to Analog Converter (DAC) comprises for each sequentially increasing combination of thermometric bit settings comprising at least two thermometric bits of a plurality of thermometric bits of the DAC coupled to a high reference voltage and each sub-binary bit of a plurality of sub-binary bits of the DAC coupled to a low reference voltage, wherein each thermometric bit comprises a higher order bit than each of the sub-binary bits, performing the steps of: determining a respective combined weightage correction; adding the combined weightage correction to the highest order bit of the combination of thermometric bit settings; and incrementing a number of bits of the combination of thermometric bit settings in response to the number of bits of the sequential combination being less than a total number of the plurality of thermometric bits.

Alternative embodiments of the method for self-calibration of reference voltage drop in a Digital to Analog Converter (DAC) include one of the following features, or any combination thereof. Each one of a plurality of thermometric weightages associated with a respective one of the plurality of thermometric bits is measured, each of the thermometric weightages is summated to generate a weightage total, a thermometric range of the DAC is measured, and a scaling factor is determined by subtracting the weightage total from the thermometric range. Measuring each thermometric weightage comprises measuring a first value of an output of the DAC while coupling each sub-binary bit to the low reference voltage, and only the respective thermometric bit to the high reference voltage, measuring a second value of the output of the DAC with all sub-binary bits and all thermometric bits coupled to the low reference voltage, and subtracting the second value from the first value, and measuring the thermometric range comprises measuring a third value of the output of the DAC while coupling each sub-binary bit to the low reference voltage, and each thermometric bit to the high reference voltage, and subtracting the second value from the third value. Determining the respective combined weightage correction comprises measuring a first value of an output of the DAC for the respective combination of thermometric bit settings, subtracting a second value of the output of the DAC, measured with all sub-binary bits and all thermometric bits coupled to the low reference voltage, and subtracting the weightage for each thermometric bit of the combination coupled to the high reference voltage.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for self-calibration of reference voltage drop in a Digital to Analog Converter (DAC) comprising:
    measuring each one of a plurality of thermometric weightages associated with a respective one of a plurality of thermometric bits, wherein the DAC comprises a plurality of sub-binary bits and the plurality of thermometric bits;
    summating each of the thermometric weightages to generate a weightage total;
    measuring a thermometric range of the DAC;
    determining a scaling factor by subtracting the weightage total from the thermometric range; and
    for each sequentially increasing combination of thermometric bit settings comprising at least two thermometric bits coupled to a high reference voltage and each sub-binary bit coupled to a low reference voltage, performing the steps of:
        determining a respective combined weightage correction,
        correcting a highest order bit of the combination of thermometric bit settings with the combined weightage correction, and
        incrementing a number of bits of the combination of thermometric bit settings in response to the number of bits of the sequential combination being less than a total number of the plurality of thermometric bits.

2. The method of claim 1 wherein measuring each thermometric weightage comprises measuring a first value of an output of the DAC while coupling each sub-binary bit to the low reference voltage, and only the respective thermometric bit to the high reference voltage, measuring a second value of the output of the DAC with all sub-binary bits and all thermometric bits coupled to the low reference voltage, and subtracting the second value from the first value.

3. The method of claim 1 wherein measuring the thermometric range comprises measuring a first value of an output of the DAC while coupling each sub-binary bit to the low reference voltage, and each thermometric bit to the high reference voltage, measuring a second value of the output of the DAC with all sub-binary bits and all thermometric bits coupled to the low reference voltage, and subtracting the second value from the first value.

4. The method of claim 1 wherein determining the respective combined weightage correction comprises measuring a first value of an output of the DAC for the respective combination of thermometric bit settings, subtracting a second value of the output of the DAC, measured with all sub-binary bits and all thermometric bits coupled to the low reference voltage, and subtracting the weightage for each thermometric bit of the combination coupled to the high reference voltage.

5. The method of claim 1 wherein a first sequentially increasing combination of thermometric bit settings comprises two thermometric bits coupled to the high reference voltage, and a remainder of the thermometric bits coupled to the low reference voltage.

6. The method of claim 1 wherein correcting the highest order bit of the combination of thermometric bit settings comprises adding the combined weightage correction to the highest order bit.

7. The method of claim 1 wherein the respective combined weightage correction is normalized with the scaling factor to form a correction with a single parameter.

8. The method of claim 7 further comprising storing each combined weightage correction in a memory.

9. The method of claim 7 further comprising adjusting a raw DAC input with one or more of the combined weightage corrections to generate a calibrated DAC input, wherein the calibrated DAC input comprises a reduced dependence on a resistive voltage drop in the high reference voltage.

10. The method of claim 1 wherein each of the thermometric bits comprise higher order bits than each of the sub-binary bits.

11. A method for self-calibration of reference voltage drop in a Digital to Analog Converter (DAC) comprising:
measuring each one of a plurality of thermometric weightages associated with a respective one of a plurality of thermometric bits, wherein the DAC comprises a plurality of sub-binary bits and the plurality of thermometric bits; and
for each sequentially increasing combination of thermometric bit settings comprising at least two thermometric bits coupled to a high reference voltage and each sub-binary bit coupled to a low reference voltage, performing the steps of:
determining a respective combined weightage correction,
adding the combined weightage correction to the highest order bit of the combination of thermometric bit settings, and
incrementing a number of bits of the combination of thermometric bit settings in response to the number of bits of the sequential combination being less than a total number of the plurality of thermometric bits.

12. The method of claim 11 wherein measuring each thermometric weightage comprises measuring a first value of an output of the DAC while coupling each sub-binary bit to the low reference voltage, and only the respective thermometric bit to the high reference voltage, measuring a second value of the output of the DAC with all sub-binary bits and all thermometric bits coupled to the low reference voltage, and subtracting the second value from the first value.

13. The method of claim 11 wherein determining the respective combined weightage correction comprises measuring a first value of an output of the DAC for the respective combination of thermometric bit settings, subtracting a second value of the output of the DAC, measured with all sub-binary bits and all thermometric bits coupled to the low reference voltage, and subtracting the weightage for each thermometric bit of the combination coupled to the high reference voltage.

14. The method of claim 11 wherein a first sequentially increasing combination of thermometric bit settings comprises two thermometric bits coupled to the high reference voltage, and a remainder of the thermometric bits coupled to the low reference voltage.

15. The method of claim 11 further comprising:
summating each of the thermometric weightages to generate a weightage total,
measuring a thermometric range of the DAC, and
determining a scaling factor by subtracting the weightage total from the thermometric range.

16. The method of claim 15 wherein measuring the thermometric range comprises measuring a first value of an output of the DAC while coupling each sub-binary bit to the low reference voltage, and each thermometric bit to the high reference voltage, measuring a second value of the output of the DAC with all sub-binary bits and all thermometric bits coupled to the low reference voltage, and subtracting the second value from the first value.

17. A method for self-calibration of reference voltage drop in a Digital to Analog Converter (DAC) comprising:
for each sequentially increasing combination of thermometric bit settings comprising at least two thermometric bits of a plurality of thermometric bits of the DAC coupled to a high reference voltage and each sub-binary bit of a plurality of sub-binary bits of the DAC coupled to a low reference voltage, wherein each thermometric bit comprises a higher order bit than each of the sub-binary bits, performing the steps of:
determining a respective combined weightage correction,
adding the combined weightage correction to the highest order bit of the combination of thermometric bit settings, and
incrementing a number of bits of the combination of thermometric bit settings in response to the number of bits of the sequential combination being less than a total number of the plurality of thermometric bits.

18. The method of claim 17 further comprising:
measuring each one of a plurality of thermometric weightages associated with a respective one of the plurality of thermometric bits,
summating each of the thermometric weightages to generate a weightage total,
measuring a thermometric range of the DAC, and
determining a scaling factor by subtracting the weightage total from the thermometric range.

19. The method of claim 18 wherein:
measuring each thermometric weightage comprises measuring a first value of an output of the DAC while coupling each sub-binary bit to the low reference voltage, and only the respective thermometric bit to the high reference voltage, measuring a second value of the output of the DAC with all sub-binary bits and all thermometric bits coupled to the low reference voltage, and subtracting the second value from the first value, and
measuring the thermometric range comprises measuring a third value of the output of the DAC while coupling each sub-binary bit to the low reference voltage, and each thermometric bit to the high reference voltage, and subtracting the second value from the third value.

20. The method of claim 17 wherein determining the respective combined weightage correction comprises measuring a first value of an output of the DAC for the respective combination of thermometric bit settings, subtracting a second value of the output of the DAC, measured with all sub-binary bits and all thermometric bits coupled to the low reference voltage, and subtracting the weightage for each thermometric bit of the combination coupled to the high reference voltage.

* * * * *